US007551742B2

(12) United States Patent
Katou et al.

(10) Patent No.: US 7,551,742 B2
(45) Date of Patent: Jun. 23, 2009

(54) ACOUSTIC SIGNAL-PROCESSING APPARATUS AND METHOD

(75) Inventors: Naoyuki Katou, Iizuka (JP); Yoshinori Kumamoto, Kasuya-Gun (JP)

(73) Assignee: Panasonic Corporation, Osaka (JP)

( * ) Notice: Subject to any disclaimer, the term of this patent is extended or adjusted under 35 U.S.C. 154(b) by 920 days.

(21) Appl. No.: 10/821,942

(22) Filed: Apr. 12, 2004

(65) Prior Publication Data

US 2004/0234083 A1 Nov. 25, 2004

(30) Foreign Application Priority Data

Apr. 17, 2003 (JP) ............................ 2003-112646
Apr. 24, 2003 (JP) ............................ 2003-119972

(51) Int. Cl.
*H03G 3/00* (2006.01)

(52) U.S. Cl. ............................ 381/61; 381/98; 84/698; 327/119

(58) Field of Classification Search .................. 381/98, 381/94.3, 61, 101, 102, 94.2, 94.1, 63, 59; 327/119; 84/600, 698
See application file for complete search history.

(56) References Cited

U.S. PATENT DOCUMENTS 6,111,960 A * 8/2000 Aarts et al. .................. 381/61
6,335,973 B1 * 1/2002 Case .......................... 381/61

FOREIGN PATENT DOCUMENTS

| | | |
|---|---|---|
| JP | 01-091510 | 4/1989 |
| JP | 7-231497 | 8/1995 |
| JP | 08-237800 | 9/1996 |
| JP | 11-509712 | 8/1999 |
| JP | P3478401 | 10/2003 |

* cited by examiner

*Primary Examiner*—Vivian Chin
*Assistant Examiner*—Con P Tran
(74) *Attorney, Agent, or Firm*—Wenderoth, Lind & Ponack, L.L.P.

(57) ABSTRACT

A band-dividing unit is operable to extract a low frequency component from an input signal in order to generate overtones based on the extracted low frequency component, and is further operable to divide the extracted low frequency component into signals that belongs to different frequency bands. Each of overtone-generating units is disposed for corresponding one of the different frequency bands, and is operable to generate overtones based on an output signal from corresponding one of band pass filters. An adder adds the generated overtones to the input signal that has passed through a delay. The resulting acoustic signal is sent to the outside through a high-pass filter. One overtone-generating unit designed for a higher frequency band among the different frequency bands is set to produce the same or fewer overtones than another overtone-generating unit suited for a lower frequency band thereamong does. This feature provides an array of continuous overtones with a less amount of calculation, while collectively generating the overtones at a lower frequency that falls within the range of a speaker reproducible band.

7 Claims, 8 Drawing Sheets

Fig. 4
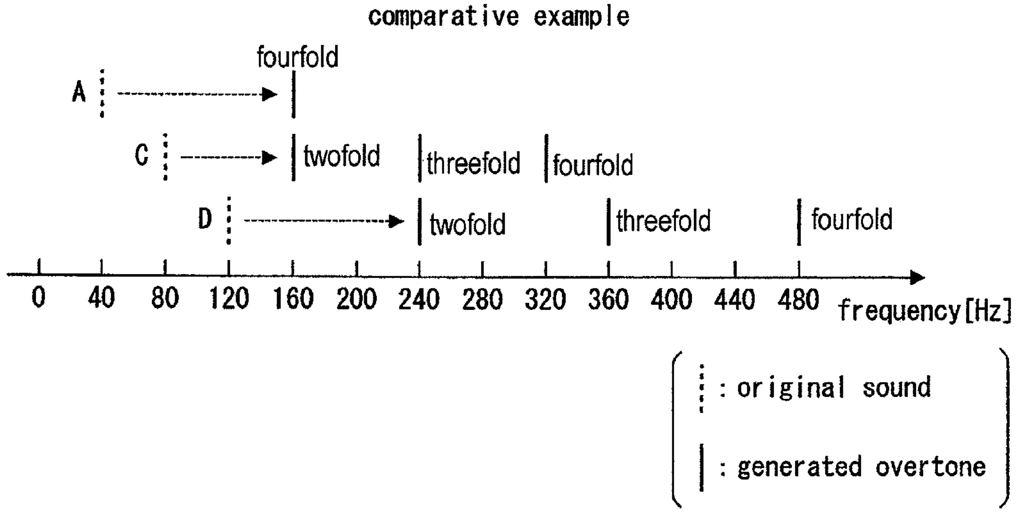
Fig. 5(a) pattern No. 1
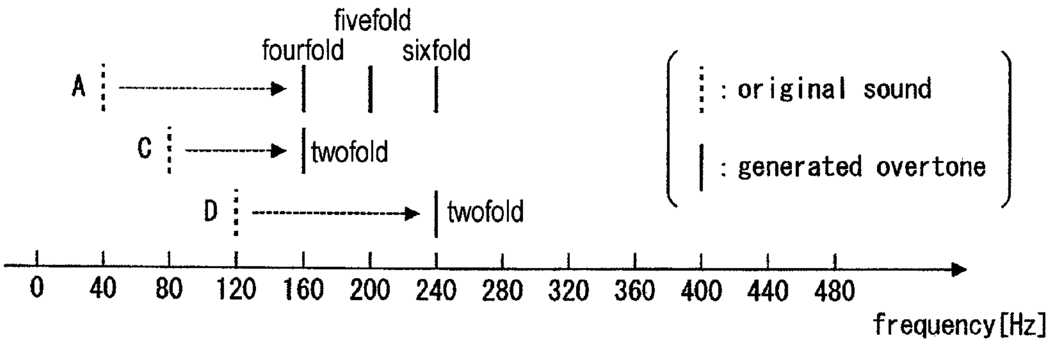
Fig. 5(b) pattern No. 2
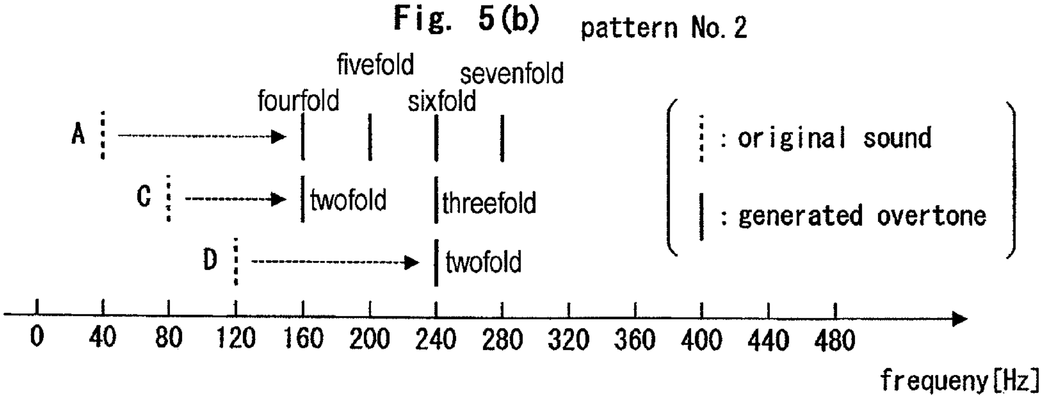

Fig. 6(a) pattern No. 3
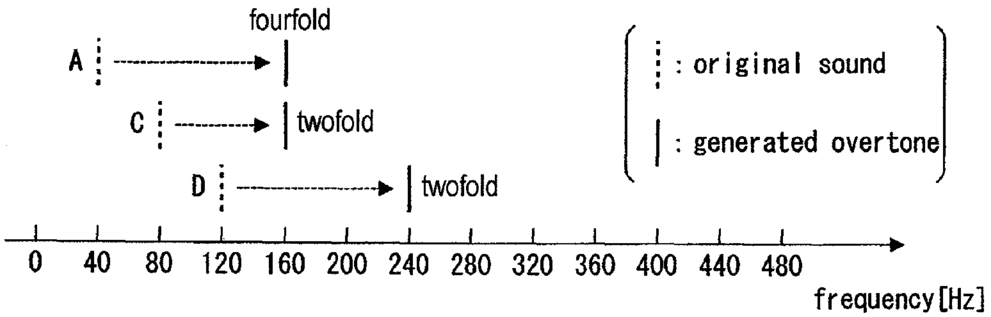
Fig. 6(b) pattern No. 4
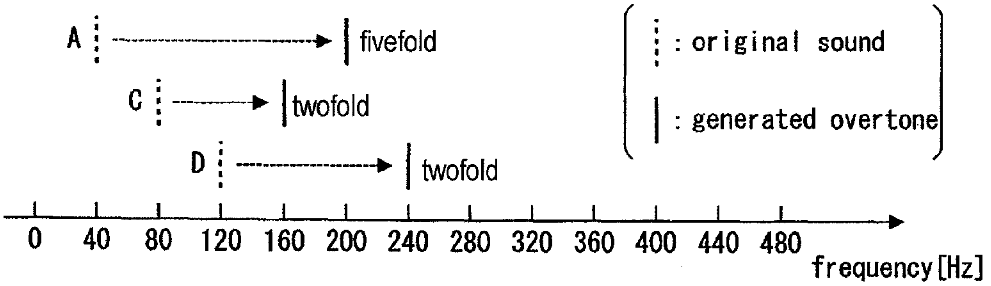

ACOUSTIC SIGNAL-PROCESSING APPARATUS AND METHOD

BACKGROUND OF THE INVENTION

1. Field of the Invention

The present invention relates to an improved acoustic signal-processing apparatus and method operable to compensate a lack of a bass sound band to provide an increased feeling of bass sound. In particular, it relates to an improved art that is operable to add a low frequency component-related overtone to provide an increased feeling of bass sound, and that is preferred for the use of, e.g., a small-sized speaker unit or an instrument prone to a deficiency in a feeling of bass sound.

2. Description of the Related Art

In general, it is well known that a small-size speaker unit is insufficient to regenerate sound at a bass sound band. One of known methods for smoothing out the issue is to regenerate harmonic overtones based on regeneration-resistant bass sound instead of regenerating the regeneration-resistant bass sound. It is well known that, according to the method as discussed above, a virtual pitch effect provides an improved feeling of audible bass sound, although the harmonic overtones are reproduced within the range of a speaker reproducible band.

The term “harmonic overtone” has two different meanings. According to one of the two different definitions, the “harmonic overtone” refers to any sound component that excludes a fundamental tone (a sound having a fundamental frequency) in a musical tone or original sound, and that has a frequency equal to a positive integer multiple of a frequency of the fundamental tone.

According to the other definition, the “harmonic overtone” refers to a sound having a frequency equal to a positive integer multiple of a frequency of a target sound.

The “harmonic overtone” herein is not differentiated from one another as above, but is simply called an “overtone”. Furthermore, an overtone having a frequency equal to an “n”-multiple (“n” is a positive integer) of a frequency of the fundamental tone or original sound is herein referred to as an “n”-fold overtone.

The following discusses two different types of prior art acoustic signal-processing apparatuses with reference to FIGS. 9 and 10.

FIG. 9(*a*) is a block diagram illustrating a first prior art acoustic signal-processing apparatus. As illustrated in FIG. 9(*a*), a signal that has entered the first acoustic signal-processing apparatus through an input terminal 1 is diverted into two systems. In the first system, one of the diverted input signals is fed into an adder 7 through one of two different input ports of the adder 7.

In the second system, another diverted input signal enters a low pass filter 5. The low pass filter 5 extracts only a low frequency component from the input signal in accordance with predetermined cut-off characteristics. The extracted low frequency component is fed into an overtone-generating unit 4.

The overtone-generating unit 4 generates a signal (an overtone) having a frequency component equal to an integer multiple of a frequency component of the extracted low frequency component. The generated overtone is fed into the adder 7 through the other input port of the adder 7.

The adder 7 adds together the respective signals that have entered the adder 7 through the two different input ports thereof. Results from the addition are fed into an output terminal 2.

There is a variety of methods for generating the overtone. The following discusses, with reference to FIG. 10, a zero-crossing process among the methods.

An overtone-generating example is now contemplated in accordance with a sinusoidal waveform as shown in FIG. 10(*a*).

A zero-crossing point is a place where a signal switches over between positive and negative values. For example, P1, P2, and P3 in FIG. 10(*a*) are the zero-crossing points at which a negative signal is turned into a positive one.

To generate a twofold overtone, an original waveform extending from a negative-to-positive zero-crossing point to another, or rather from a distance between P1 to P2 to another between P2 to P3 may be compressed into a half of the original waveform in the direction of a time axis to repeatedly regenerate the compressed waveform twice. As a result, as illustrated in FIG. 10(*b*), the processed signal has twice as high frequency as that of the original signal.

In general, when “n” is a positive integer, an original waveform extending between the same zero-crossing point is compressed into one over “n” of the original waveform in the direction of the time axis to repeatedly regenerate the compressed waveform a “n”-number of times, thereby generating an “n”-fold overtone.

When complex sound (e.g., a chord or a sound having several frequency components) enters the first prior art acoustic signal-processing apparatus of FIG. 9 (*a*), then frequency components other than a target overtone to be generated are objectionably produced. As a result, the generated overtone is distorted, with a concomitant degradation in sound quality.

The drawback as discussed above is overcome by a second prior art acoustic signal-processing apparatus of FIG. 9(*b*). The following discusses the second prior art acoustic signal-processing apparatus with reference to FIG. 9(*b*). In FIG. 9(*b*), components similar to those of FIG. 9(*a*) are identified by the same reference characters.

As illustrated in FIG. 9(*b*), the second prior art acoustic signal-processing apparatus has improvements in which the complex sound is divided into several frequency bands to generate an overtone based on each component that belongs to corresponding one of the divided frequency bands.

The second prior art acoustic signal-processing apparatus of FIG. 9(*b*) includes a band-dividing unit 6 that is absent in the first prior art acoustic signal-processing apparatus of FIG. 9(*a*). The band-dividing unit 6 includes a plurality of band pass filters “5*a*” to “5*c*” designed for different frequency bands, thereby permitting a low frequency component in an input signal to be divided into several signals, each of which belongs to corresponding one of the different frequency bands.

The divided signals are fed into overtone-generating units “4*a*” to “4*c*”, each of which is provided for a corresponding one of the different frequency bands. In each of the overtone-generating units “4*a*” to “4*c*”, an overtone is generated. An adder “7*a*” adds together output signals from the overtone-generating units “4*a*” to “4*c*”. The added output signals are fed into another adder “7*b*” through one of two different input ports of the adder “7*b*”.

In principle, the division of the frequency band as illustrated in FIG. 9(*b*) generates an overtone based on a single frequency component signal for each of the frequency bands, even when the complex sound enters the second prior art acoustic signal-processing apparatus of FIG. 9(*b*). This feature suppresses the occurrence of distortional components.

The frequency band-dividing method as discussed above advantageously suppresses degradation in sound quality when the complex sound enters the second prior art acoustic signal-processing apparatus of FIG. 9(*b*). However, the prior art takes no account of the way in which the overtone should be generated based on the component for each of the divided frequency bands.

The present inventors have revealed based on their studies at this time that a poorly structured overtone degrades tone quality, and results in an insufficient effect on improvements in a feeling of bass sound. Details of those shortcomings are described later. It is understood from the shortcomings that the overtone-generating structure as illustrated in FIG. 9(*b*) yet remains unsatisfactory.

OBJECTS AND SUMMARY OF THE INVENTION

In view of the above, an object of the present invention is to provide an overtone-generating art that provides a high effect on improvements in a feeling of bass sound and a less feeling of distortion in an acoustic signal-processing apparatus designed to divide a frequency band into several frequency components.

A first aspect of the present invention provides an acoustic signal-processing apparatus comprising: a band-dividing unit operable to divide a low frequency component in an entering acoustic signal into filtered components that belong to several frequency bands; an overtone-generating unit operable to generate a plurality of overtone components based on each of the filtered components that belong to the several frequency bands; and a combining unit operable to combine the entering acoustic signal with the plurality of overtone components generated by the overtone-generating unit, wherein the overtone-generating unit is operable to generate the plurality of overtone components in such a manner that the plurality of overtone components generated by the overtone-generating unit meet a given condition.

According to the above system, certain conditions to permit the overtone-generating unit to generate overtones are provided. This feature eliminates the generation of improper overtones, and produces favorable overtones. As a result, an improved feeling of bass sound and a suppressed feeling of distortion are attainable.

A second aspect of the present invention provides an acoustic signal-processing apparatus as defined in the first aspect of the present invention, wherein the given condition is concerned with a degree of each of the plurality of overtone components generated by the overtone-generating unit.

According to the above system, the use of the degree makes it feasible to define certain conditions concisely, and the overtone-generating unit is required to generate only overtone components having degrees of interest. As a result, the overtone-generating unit is less burdened with operations to generate the overtones.

A third aspect of the present invention provides an acoustic signal-processing apparatus as defined in the first aspect of the present invention, wherein the given condition defines that the plurality of overtone components generated by the overtone-generating unit fall within a range of a given frequency.

The above system obviates the occurrence of overtones that lie outside of an envisaged speaker reproducible band. More specifically, a first feature that obviates the occurrence of overtone components having excessively high frequencies prevents regenerated sound from being deviated toward an intermediate- or high-pitched sound, and provides a natural tone without awkward variations in tone. A second feature that obviates the occurrence of overtone components having excessively low frequencies avoids overloading a speaker unit.

A fourth aspect of the present invention provides an acoustic signal-processing apparatus as defined in the first aspect of the present invention, wherein the overtone-generating unit generates one or more overtone components based on each of the filtered components that belong to the several frequency bands; and wherein the given condition defines that a number of the one or more overtone components generated based on a filtered component that belongs to a higher frequency band among the several frequency bands is not greater than a number of the one or more overtone components generated based on a filtered component that belongs to a lower frequency band among the several frequency bands.

The above system produces a naturally structured overtone, not an awkward one. The above system collectively generates overtones having lower frequencies, not higher frequencies, and operatively provides an improved feeling of bass sound.

A fifth aspect of the present invention provides an acoustic signal-processing apparatus as defined in the first aspect of the present invention, wherein the given condition defines generation of a plurality of overtone components for each of the several frequency bands, the plurality of overtone components having at least one of a reachable least degree and an degree greater than the reachable least degree, the reachable least degree being a least degree that reaches an envisaged speaker reproducible band.

According to the above system, the use of the reachable least degree makes it feasible to produce a favorable overtone component concisely and properly based on each of the components that belongs to the several frequency bands.

A sixth aspect of the present invention provides an acoustic signal-processing apparatus as defined in the first aspect of the present invention, wherein the given condition defines that the plurality of overtone components generated by the overtone-generating unit fall within a range of a given frequency, and defines that the plurality of overtone components have a reachable least degree and a degree that is greater than the reachable least degree but falls within the range of the given frequency, the reachable least degree being a least degree that reaches an envisaged speaker reproducible band.

The above system obviates the occurrence of overtones that lie outside of the envisaged speaker reproducible band. More specifically, a first feature that obviates the occurrence of overtone components having excessively high frequencies prevents regenerated sound from being deviated toward an intermediate- or high-pitched sound, and provides a natural tone without awkward variations in tone. A second feature that obviates the occurrence of overtone components having excessively low frequencies avoids overloading a speaker unit.

According to the above system, the use of the reachable least degree makes it feasible to generate a favorable overtone component concisely and properly based on each of the components that belongs to the several frequency bands.

A seventh aspect of the present invention provides an acoustic signal-processing apparatus as defined in the first aspect of the present invention, wherein the given condition defines that the plurality of overtone components generated by the overtone-generating unit fall within a range of a given frequency, and that only a plurality of overtone components having a single degree for each of the several frequency bands are generated.

The above system provides an improved feeling of bass sound with a less burden of operations to generate the overtones.

An eighth aspect of the present invention provides an acoustic signal-processing apparatus as defined in the seventh aspect of the present invention, in which the single degree is a reachable least degree, and the reachable least degree is a least degree that reaches an envisaged speaker reproducible band.

The above system collectively generates low frequency components at a lower frequency band among the envisaged speaker reproducible band, and operatively provides an improved feeling of bass sound.

A ninth aspect of the present invention provides an acoustic signal-processing apparatus as defined in the seventh aspect of the present invention, in which the single degree is set in such a manner that the plurality of overtone components generated based on the filtered components that belong to the several frequency bands have frequencies non-overlapped with each other.

The above system provides low frequency components that have a series of continuous degrees with ease, and consequently regenerates natural sound with a less feeling of distortion.

A tenth aspect of the present invention provides an acoustic signal-processing apparatus as defined in the first aspect of the present invention, wherein each of the plurality of overtone components have amplitude set to decrease with an increase in frequency.

The above system provides regenerated sound that is precluded from being deviated audibly toward an intermediate- or high-pitched sound.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1(*b*) is a block diagram illustrating overtone-producing units according to the first embodiment;

FIG. 2(*b*) is an illustration showing another example of band-dividing characteristics according to the first embodiment;

FIG. 2(*c*) is an illustration showing yet another example of band-dividing characteristics according to the first embodiment;

FIG. 4 is a descriptive illustration showing an overtone-generating, comparative example according to the first embodiment;

FIG. 5(*a*) is a descriptive illustration showing an overtone-generating pattern 1 according to the first embodiment;

FIG. 5(*b*) is a descriptive illustration showing an overtone-generating pattern 2 according to the first embodiment;

FIG. 6(*a*) is a descriptive illustration showing an overtone-generating pattern 3 according to a second embodiment;

FIG. 6(*b*) is a descriptive illustration showing an overtone-generating pattern 4 according to the second embodiment;

FIG. 8(*b*) is a block diagram illustrating an acoustic signal-processing apparatus according to variation 2 of the present invention;

FIG. 9(*b*) is a block diagram illustrating a second prior art acoustic signal-processing apparatus; FIG. 10(*b*) is a descriptive illustrating showing a prior art overtone-generating principle.

DETAILED DESCRIPTION OF THE PREFERRED EMBODIMENTS

Embodiments of the present invention are now described with reference to the accompanying drawings.

COMPARATIVE EXAMPLE

Before overtone-generating methods according to embodiments of the present invention are described, a comparative example of overtone production is now discussed. In conclusion, the comparative example as discussed below demonstrates that a problem arises when a musical tone has a low fundamental tone, and when overtones having low degrees, which are generated based on the musical tone as just discussed, are in the range below a speaker reproducible band.

Figure 2A:
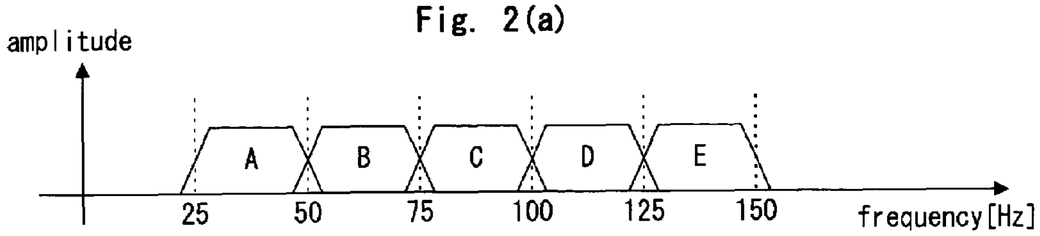
FIG. 2(*a*) is an illustration showing an example of band-dividing characteristics according to the first embodiment.
Figure 2B:
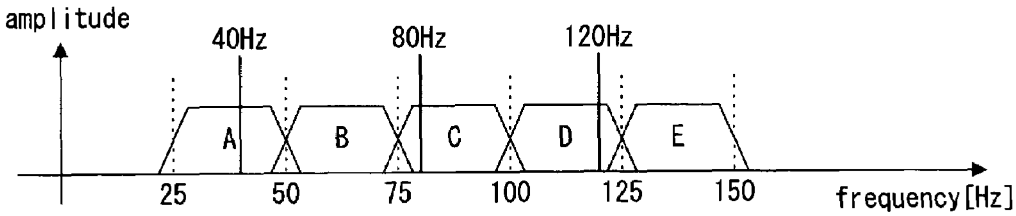
Figure 2C:
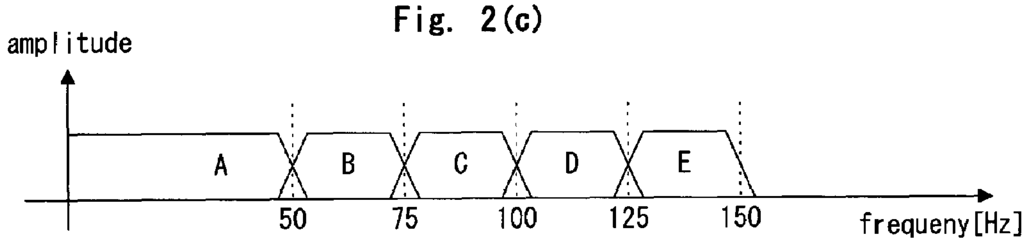

Assume herein that the speaker reproducible band is 150 Hz or higher; as illustrated in FIG. 2(*a*), a frequency band is divided at intervals of 25 Hz to generate overtones; and twofold to fourfold overtones are generated at the divided frequency bands, but not overtones having frequencies of less than 150 Hz.

The present comparative example generates:

- only a fourfold overtone at frequency band “A” (25 to 50 Hz);
- threefold and fourfold overtones at frequency band “B” (50 to 75 Hz);
- twofold to fourfold overtone at each of frequency bands “C” (75 to 100 Hz), “D” (100 to 125 Hz), and “E” (125 to 150 Hz).

In the present comparative example, assume that a musical tone having a fundamental tone of 40 Hz enters an acoustic signal-processing apparatus. In this instance, as illustrated in FIG. 2(*b*), a frequency band to be processed includes three frequency components: the fundamental tone (40 Hz); a twofold overtone (80 Hz); and a threefold overtone (120 Hz).

The three frequency components are separated from each other by the division of the frequency band. As a result, the frequency components of 40, 80, and 120 Hz belong to frequency bands “A”, “C”, and “D”, respectively; and one or greater overtones are generated for each of those frequency bands.

FIG. 4 illustrates results from the generation of the overtones. The generated overtones are:

- an overtone having a frequency of 160 Hz based on the fundamental tone (40 Hz) that belongs to frequency band “A” (25 to 50 Hz);

overtones having frequencies of 160, 240, and 320 Hz based on the twofold overtone (80 Hz) that belongs to frequency band "C" (75 to 100 Hz); and overtones having frequencies of 240, 360, and 480 Hz based on the threefold overtone (120 Hz) that belongs to frequency band "D" (125 to 150 Hz) "D" (100 to 125 Hz).

As a result, the comparative example produces a total of overtone components having frequencies of 160, 240, 320, 360, and 480 Hz.

The overtones thus generated can be allocated to degrees with reference to the fundamental tone of 40 Hz in the original signal. The overtones having the allocated degrees are arranged in a manner that follows:

a fourfold overtone (160 Hz);
a sixfold overtone (240 Hz);
an eightfold overtone (320 Hz);
a ninefold overtone (360 Hz); and
a twelvefold overtone (480 Hz).

As seen from the above, fivefold and sevenfold overtones are absent in the generated overtones, while overtones having high degrees such as the ninefold and twelvefold overtones are present, but never contribute to improvements in a feeling of bass sound.

The formation of such irregularly structured overtones fails to provide an improved feeling of bass sound, and further produces an objectionable feeling that regenerated sound is displaced toward intermediate- or high-pitched sound, or introduces peculiar variations in tone.

As evidenced by the above, there is a need for a guideline to generate properly structured overtones to produce an improved feeling of bass sound. In accordance with such knowledge, the present inventors have completed the improved art as herein proposed. Embodiments as described below and the present comparative example are collectively evaluated in detail at the end of the description.

First Embodiment

Figure 1A:
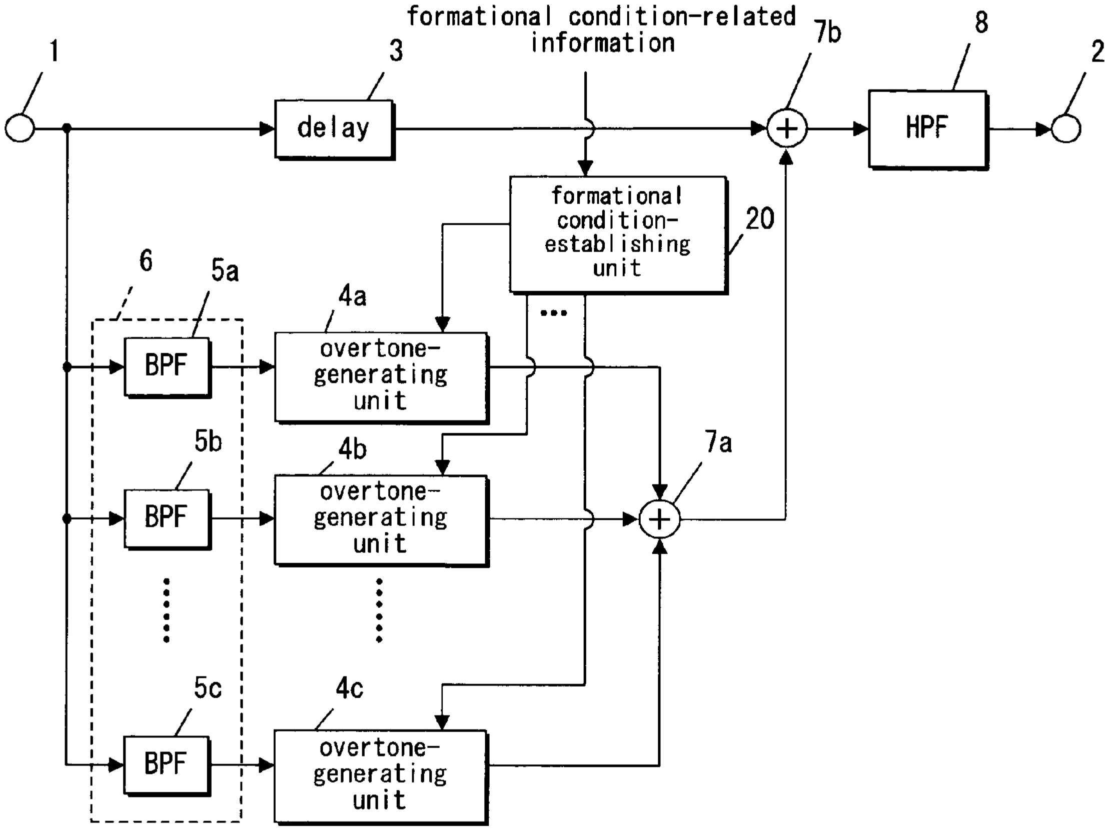
FIG. 1(*a*) is a block diagram illustrating an acoustic signal-processing apparatus according to a first embodiment of the present invention.
Figure 1B:
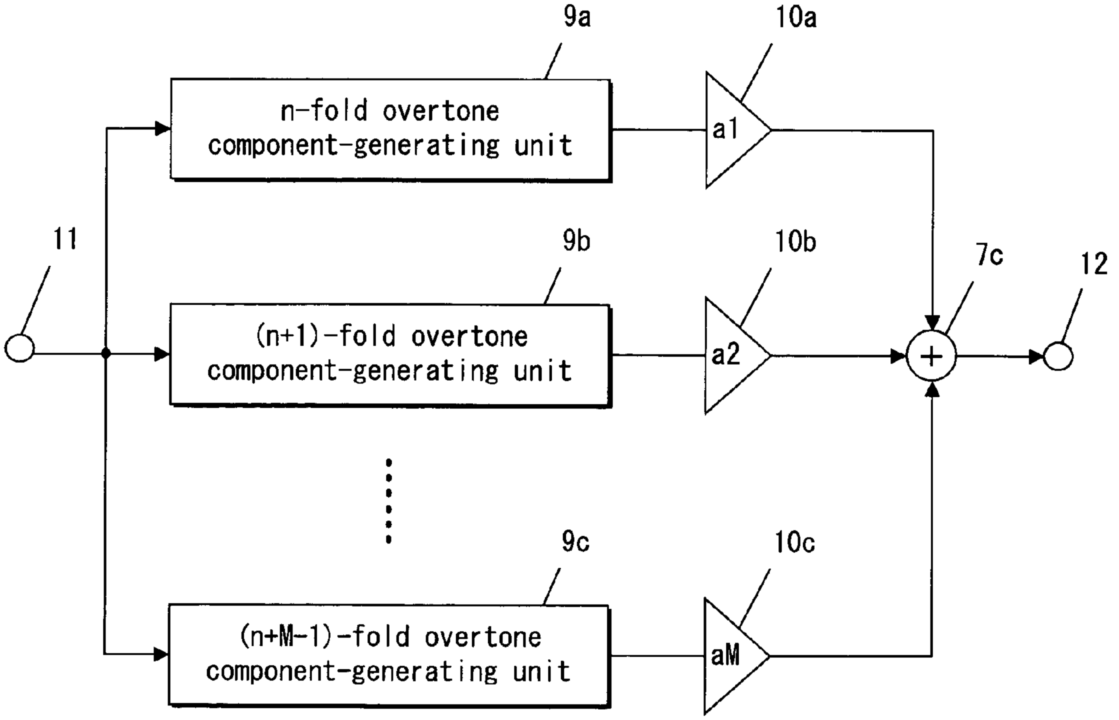

A first embodiment of the present invention is now described with the drawings. FIG. 1 is a block diagram illustrating an acoustic signal-processing apparatus according to the present embodiment.

Similar to the comparative example, the present and next embodiments presuppose that: a speaker reproducible band is 150 Hz or greater; overtone components are generated for a low frequency band of 150 Hz or less; and each of the generated overtone components has a definite frequency range of 150 to 280 Hz. It is understood that those numeral values are offered merely by way of one example, and, of course, may appropriately be changed.

In FIG. 1(*a*), an input signal enters an input terminal 1.

A band-dividing unit 6 is operable to extract low frequency components that belong to several frequency bands from the input signal in order to generate overtones based on the extracted low frequency components. The band-dividing unit 6 includes parallel-arranged band pass filters "5*a*" to "5*c*" suited for different pass bands.

Each of overtone-generating units "4*a*" to "4*c*" is disposed for corresponding one of the frequency bands, and is operable to produce overtones based on an output signal from corresponding one of the band pass filters "5*a*" to "5*c*".

An adder "7*a*" is operable to add together output signals from the overtone-generating units "4*a*" to "4*c*". A delay 3 is operable to delay the input signal by the same period of time as a delayed period of time associated with the generation of the overtones.

An adder "7*b*" serves as a combining unit. More specifically, the adder "7*b*" is operable to add an output signal from the adder "7*a*" to an output signal from the delay 3, thereby sending out an acoustic signal from an output terminal 2 through a high-pass filter 8.

The high-pass filter 8 is disposed to remove, from the acoustic signal, low frequency components that are in the range below the speaker reproducible band, in order to avoid overloading a speaker unit.

The high-pass filter 8 may be either followed or preceded in position by the delay 3. The high-pass filter 8 may be removed from the acoustic signal-processing apparatus according to the present embodiment, although the acoustic signal-processing apparatus according thereto becomes free of an overload-proof function.

To provide an acoustic signal-processing apparatus suited for stereo input, one circuit as illustrated in FIG. 1(*a*) is provided to function as the right channel, while another of FIG. 1(*a*) is disposed to serve as the left channel.

Figure 7:
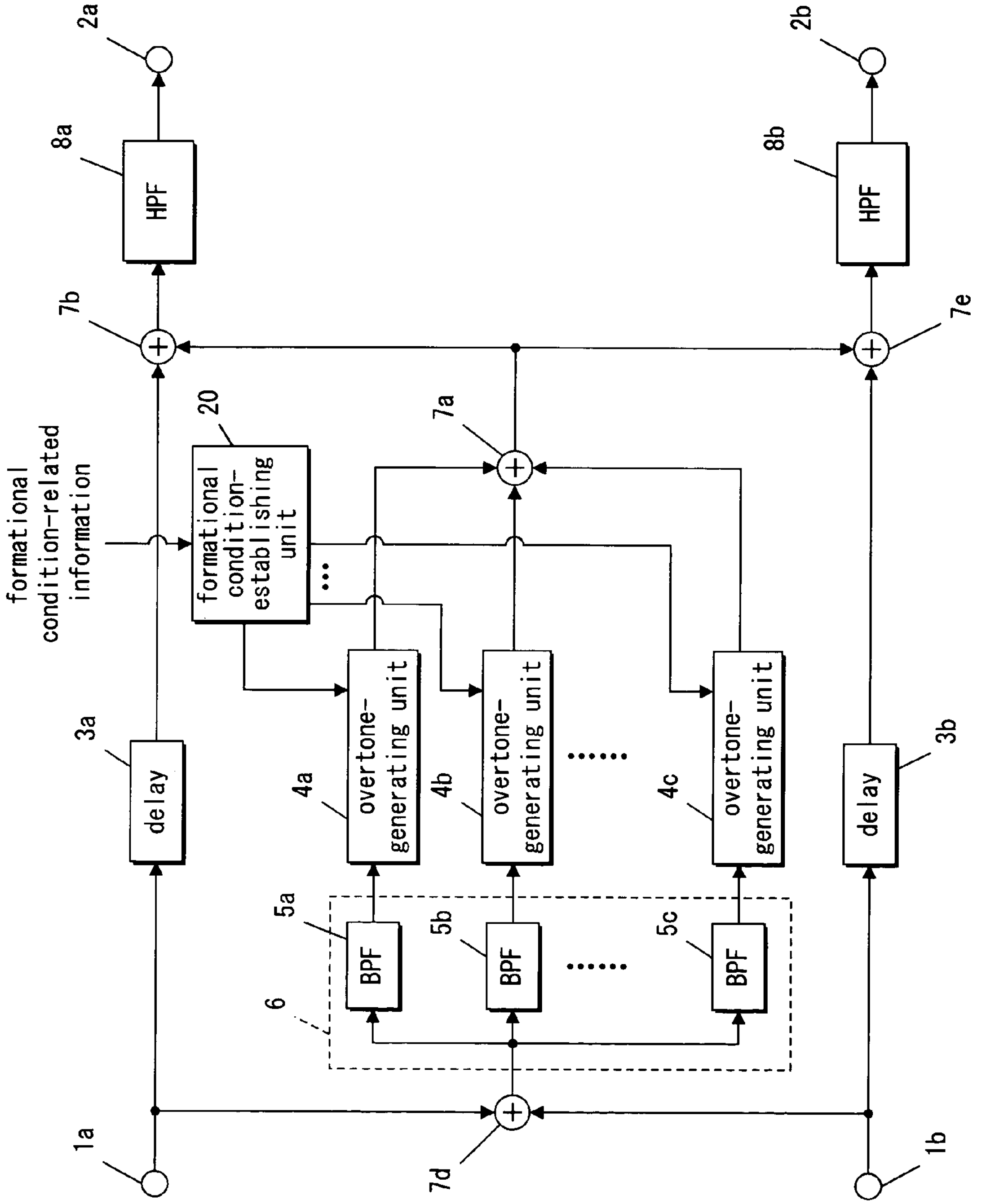
FIG. 7 is a block diagram illustrating an acoustic signal-processing apparatus suited for stereo signal input-output according to the first embodiment.

Alternatively, a circuit as illustrated in FIG. 7 may be used. More specifically, left and right inputs having entered the circuit of FIG. 7 are added together, thereby providing a monophonic signal. The monophonic signal is processed to generate an overtone. The generated overtone is split into right and left output.

The structure as illustrated in FIG. 7 provides a smaller-sized circuit than the right and left circuits of FIG. 1(*a*), which are separately disposed for the left and right channels. Because the low frequency components having the same phase are often included in the right and left channels, such a simplified structure as shown in FIG. 7 provides substantially constant sound quality.

Similar to the comparative example, pursuant to the present embodiment, the band-dividing unit 6 has band-dividing characteristics established as illustrated in FIG. 2(*a*). As seen from FIG. 2(*a*), the frequency band of 25 Hz to 150 Hz is divided into several frequency bands by the frequency band of 25Hz.

Alternatively, the band-dividing unit 6 may have band-dividing characteristics set up as illustrated in FIG. 2(*c*), in which the lowest sound band (50 Hz or less) is handled as low pass characteristics.

FIG. 1(*b*) illustrates a circuit structure of the overtone-generating units "4*a*" to "4*c*", each of which is disposed for corresponding one of the frequency bands.

The overtone-generating units "4*a*" to "4*c*" include overtone component-generating units "9*a*" to "9*c*", respectively. The overtone component-generating units "9*a*" to "9*c*" generate an "M"-number of overtones based on the input signal. The "M"-number of overtones consists of an "n"-fold overtone up to a (n+M−1)-fold overtone. The overtone component-generating units "9*a*" to "9*c*" are followed by multipliers "10*a*" to "10*c*", respectively. The multipliers "10*a*" to "10*c*" multiply the output from the overtone component-generating units "9*a*" to "9*c*" by coefficients "a1" to "aM", respectively. An adder "7*c*" adds together the output from the multipliers "10*a*" to "10*c*".

Figure 3:
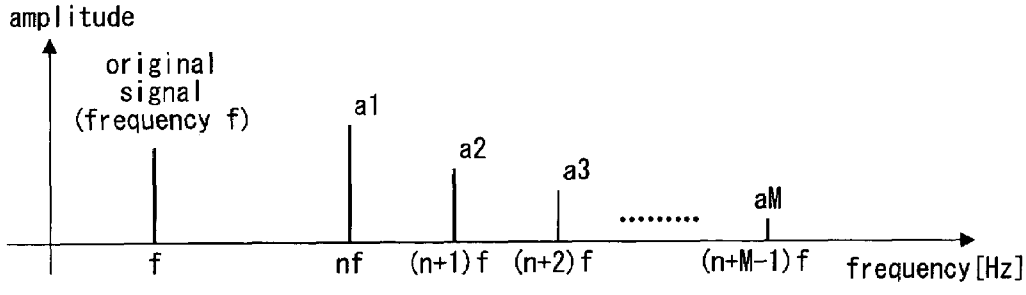
FIG. 3 is a graph illustrating an example of an overtone-generating amplitude structure according to the first embodiment.

More specifically, as illustrated in FIG. 3, the "M"-number of overtones continuously arrayed from the "n"-fold overtone having the least degree are generated based on a signal separated for each of the frequency bands. The "n"-fold overtone having the least degree falls within the range of the speaker-reproducible band. The train of coefficients "a1" to "aM" serves to regulate an amplitude level of each of the overtones. The train of coefficients "a1" to "aM" is represented by a train of coefficients in which a higher degree has an increasingly attenuating value. For example, a geometrical progression with geometrical ratio “r” (a1, a1×r, a1×r×r, etc.) may be used as the train of coefficients “a1” to “aM”. The geometrical ratio “r” can be, e.g., 0.3.

Referring back to FIG. 1(*a*), formational condition-related information enters a formational condition-establishing unit 20 from the outside. The formational condition-establishing unit 20 allows given conditions of overtone production to be established in the overtone-generating units “4*a*” to “4*c*”. The formational condition-related information is concerned with the degrees (n, n+M−1) of the overtone components, the coefficient such as “a1”, and the geometrical ratio “r” as mentioned above.

As illustrated in FIG. 1(*a*), the formational condition-establishing unit 20 is able to change the given conditions in the overtone-generating units “4*a*” to “4*c*”.

Alternatively, the formational condition-establishing unit 20 may be removed from the acoustic signal-processing apparatus according to the present embodiment when a single certain condition is used. In the alternative, each of the overtone-generating units “4*a*” to “4*c*” may have a circuit fixedly constructed to meet the desired certain conditions. In this instance, the overtone-generating units need not be provided for all of the “n”-fold to (n+M−1)-fold overtones, as opposed to the structure of FIG. 1(*b*). More specifically, when there is an overtone having an unused degree, then a corresponding overtone-generating unit may be removed to provide a simpler circuit structure.

The following discusses an overtone-generating method, the subject matter of the present invention. A reachable least degree is now described. The reachable least degree refers to the least degree that reaches the speaker-reproducible band (150 Hz or greater as discussed herein) to generate overtones based on a signal component for each of the divided frequency bands.

For example, the reachable least degree in FIG. 2(*a*) includes:

a threefold degree at frequency band “B” (50 to 75 Hz);

a twofold degree at frequency band “C” (75 to 100 Hz);

a twofold degree at frequency band “D” (100 to 125 Hz); and a twofold degree at frequency band “E” (125 to 150 Hz).

The reachable least degree at frequency band “A” (25 to 50 Hz) includes a sixthfold degree at the frequency of 25 to 30 Hz, a fifthfold degree at the frequency of 30 to 37.5 Hz, and a fourfold degree at the frequency of 37.5 to 50 Hz.

As discussed above, there are cases where several candidates for reachable least degrees are present, depending upon band-dividing characteristics, and therefore a single reachable least degree cannot be determined. In this instance, any one of the candidates can be set to be a reachable least degree. Accordingly, the reachable least degree at frequency band “A” is now set to be a fourfold degree.

The following discusses the way in which overtones are generated using the reachable least degree as previously mentioned. Pursuant to the present embodiment, either a single overtone having a reachable least degree or several overtones having a series of continuous degrees including the single overtone having the reachable least degree are generated for each of the frequency bands. At this time, the point is that an increasing number of overtones are generated at a lower frequency band among the different frequency bands.

For example, patterns 1 and 2 are now contemplated.

Pattern 1 generates:

fourfold, fivefold, and sixfold overtones at frequency band “A”;

threefold and fourfold overtones at frequency “B”; and a twofold overtone at each of frequency bands “C”, “D”, and “E”.

Pattern 2 generates:

fourfold, fivefold, sixfold, and sevenfold overtones at frequency band “A”;

threefold and fourfold overtones at frequency “B”;

twofold and threefold overtones at frequency band “C”; and a twofold overtone at each of frequency bands “D”, and “E”.

The overtone-generating method as discussed above provides a natural overtone not an awkwardly structured one, even when a musical tone having a low fundamental frequency enters the acoustic signal-processing apparatus according to the present embodiment. The following discusses the reason why such natural overtones are attainable.

Assume that the musical tone is an original signal. In this instance, the original signal includes a fundamental tone and an overtone having a frequency equal to an “n”-multiple (“n”=2, 3, etc.) of a frequency of the fundamental tone. The fundamental tone may be considered as an “n”-fold overtone (“n”=1).

The overtone-generating unit produces an “m”-fold overtone (“m”=2, 3, etc.) based on the original signal. The generated “m”-fold overtone has a frequency equal to an “n” times “m” multiple of a frequency of the fundamental tone in the original sound.

At this time, the formation of an overtone having an excessively high degree produces an objectionable feeling that a tone is deviated toward intermediate- or high-pitched sound. Accordingly, there is an upper limit to the degree of “n” times “m”. More specifically, “m” definitely decreases in value with an increase in “n”. In other words, a large number of overtones having higher degrees can be added at the lowest frequency band such as frequency band “A”, but only an overtone having a lower degree can be generated at a higher frequency band such as frequency band “E”.

Assume that the value of the degree of “n” times “m” is a prime number. In this instance, the overtones can be generated only for “n”=1 or only from the fundamental tone in the original signal. For example, the fivefold or sevenfold overtone with reference to the fundamental tone in the original signal can be generated based on only the fundamental tone in the original signal. Accordingly, an increasing number of overtones are advisably generated at a lower frequency band because such an advisable method is resistant to the formation of a train of awkward overtones.

The following discusses a train of signals representative of a musical tone having a fundamental tone (40 Hz) as an original signal, in which the original signal further includes the overtone components having frequencies of 80 and 120 Hz, as previously described.

Pattern 1 as illustrated in FIG. 5(*a*) generates:

overtones having the frequencies of 160, 200, and 240 Hz based on the 40 Hz component that belongs to frequency band “A”;

an overtone having the frequency of 160 Hz based on the 80 Hz component that belongs to frequency band “C”; and an overtone having the frequency of 240 Hz based on the 120 Hz component that belongs to frequency band “D”.

Pattern 2 as illustrated in FIG. 5(*b*) generates:

overtones having the frequencies of 160, 200, 240, and 280 Hz based on the 40 Hz component that belongs to frequency band “A”;

overtones having the frequencies of 160 and 240 Hz based on the 80 Hz component that belongs to frequency band “C”; and an overtone having the frequency of 240 Hz based on the 120 Hz component that belongs to frequency band “D”.

Pattern 1 produces a series of continuous overtones in the range of the fourfold to sixfold overtone based on the fundamental tone in the original signal.

Pattern 2 generates a series of continuous overtones in the range of the fourfold to sevenfold overtone based on the fundamental tone in the original signal.

Both of patterns 1 and 2 never generate excessively high-pitched overtones such as ninefold or greater overtones. As a result, the overtone-generating method according to the present embodiment provides an output signal that produces a feeling of an improved bass sound because the same overtone-generating method less produces an objectionable feeling that a sound level is displaced toward an intermediate- or high-pitched sound, and less introduces peculiar variations in tone.

In conclusion, pursuant to the overtone-structuring method according to the present embodiment, naturally structured overtones having an array of continuous degrees can be generated within the range of the speaker reproducible band, even when the acoustic signal-processing apparatus according to the present invention receives a musical tone having a low fundamental frequency in which plural frequency components are present at the frequency band to be processed. This feature makes it feasible to suppress degradation in tone quality, which otherwise would occur heavily upon the entry of the musical tone having the low fundamental frequency. Furthermore, fewer overtones are generated at a higher frequency band among the different frequency bands. This feature advantageously provides a smaller-sized circuit required to produce the overtones.

Second Embodiment

Pursuant to a second embodiment, another overtone-structuring method to generate overtones is performed using the same circuit as that of the previous embodiment (see FIGS. 1(*a*), 1(*b*), and FIG. 7). In short, the overtone-structuring method according to the present embodiment generates only a single overtone having a reachable least degree or equivalent for each frequency band.

For example, patterns 3 and 4 at frequency bands as illustrated in FIG. 2(*a*) are now contemplated.

Pattern 3 generates:

a fourfold overtone at frequency band “A”;

a threefold overtone at frequency band “B”; and a twofold overtone at each of frequency bands “C”, “D”, and “E”.

Pattern 4 generates:

a fivefold overtone at frequency band “A”;

a threefold overtone at frequency band “B”; and a twofold overtone at each of frequency bands “C”, “D”, and “E”.

As illustrated in FIG. 2(*b*), similar to the previous embodiment, assume that a train of signals represents a musical tone having a fundamental tone of 40 Hz as an original signal, in which the original signal further includes overtone components having frequencies of 80 and 120 Hz.

Pattern 3 as illustrated in FIG. 6(*a*) generates:

an overtone having the frequency of 160 Hz based on the 40 Hz component that belongs to frequency band “A”;

an overtone having the frequency of 160 Hz based on the 80 Hz component that belongs to frequency band “C”; and an overtone having the frequency of 240 Hz based on the 120 Hz component that belongs to frequency band “D”.

Pattern 4 as illustrated in FIG. 6(*b*) generates:

an overtone having the frequency of 200 Hz based on the 40 Hz component that belongs to frequency band “A”;

an overtone having the frequency of 160 Hz based on the 80 Hz component that belongs to frequency band “C”; and an overtone having the frequency of 240 Hz based on the 120 Hz component that belongs to frequency band “D”.

A feeling of bass sound produced by pattern 3 is somewhat poor because pattern 3 does not generate a fivefold overtone (200 Hz) based on the fundamental tone in the original signal. Pattern 4 is better than pattern 3 because of the continuous formation of fourfold to sixfold overtone in pattern 4.

The overtone-structuring method according to the present embodiment provides only a single overtone for each of the frequency bands. As a result, the present embodiment is rather inferior to the previous embodiment in terms of an improved feeling of bass sound. However, the present embodiment advantageously requires a less amount of calculation, and provides a smaller-sized circuit. Furthermore, the present embodiment provides reduced distortions accompanying the formation of the overtones, thereby achieving articulate sound quality.

The previous and present embodiments have been described on the premise of the speaker reproducible band of 150 Hz or greater. However, it is well understood that the present invention is not limited to a certain speaker reproducible band, but is applicable to a variety of small-sized speaker units designed for different reproducible bands.

(Variation 1)

Figure 8A:
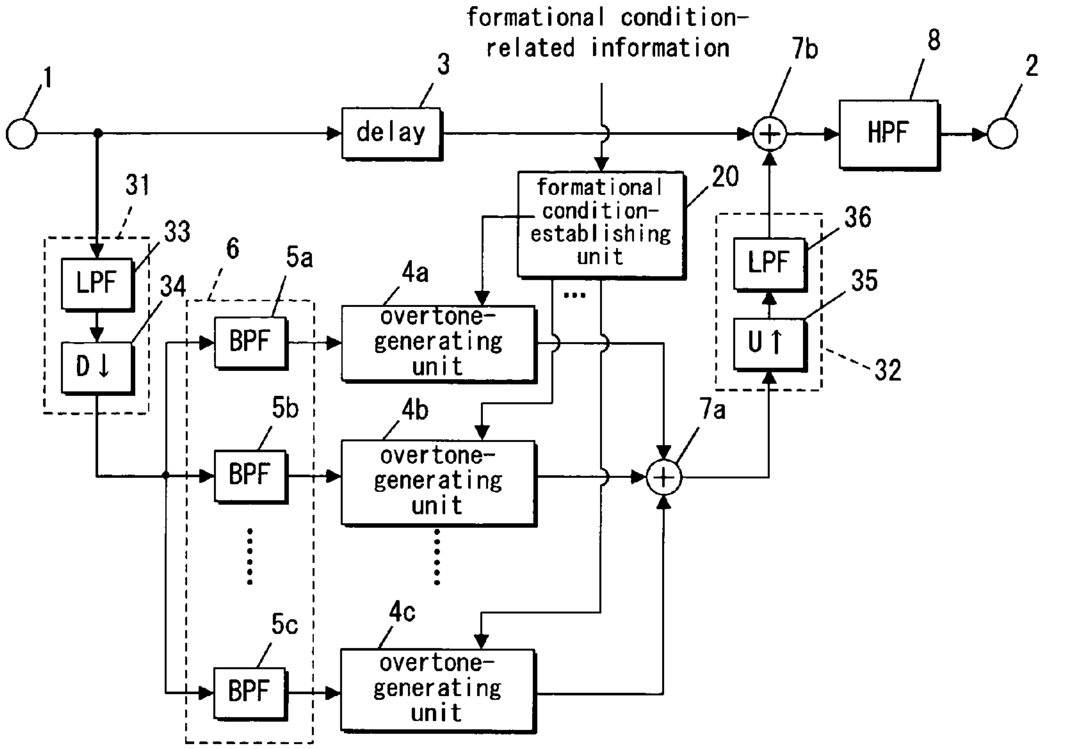
FIG. 8(*a*) is a block diagram illustrating an acoustic signal-processing apparatus according to variation 1 of the present invention.
Figure 8B:
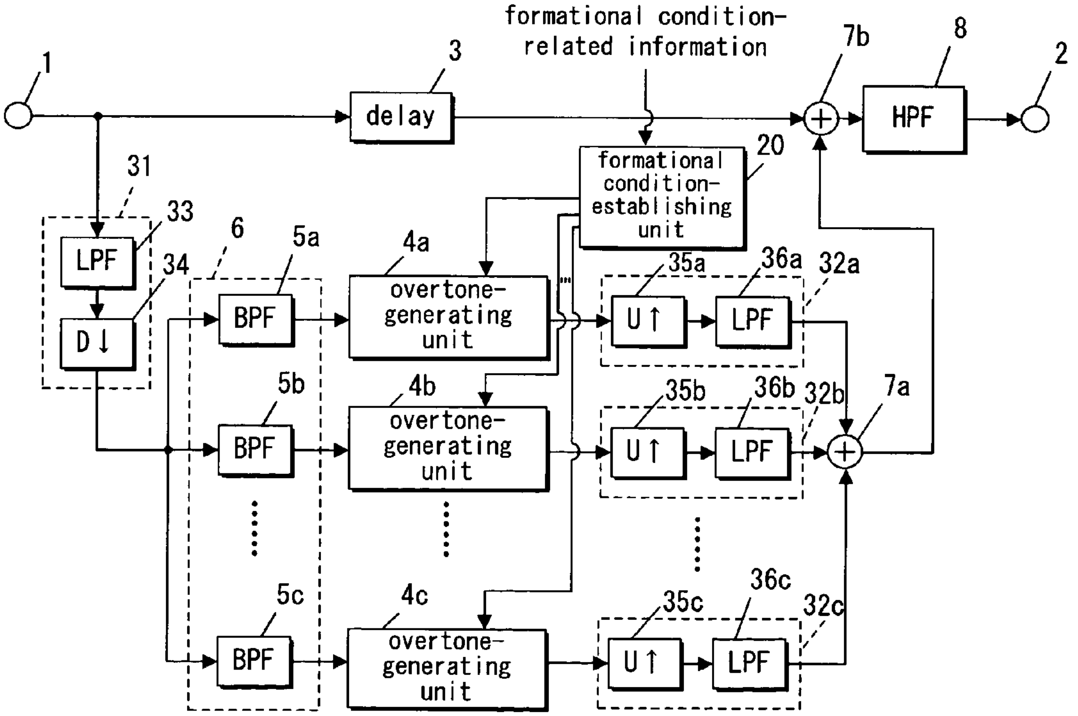
Figure 9A:
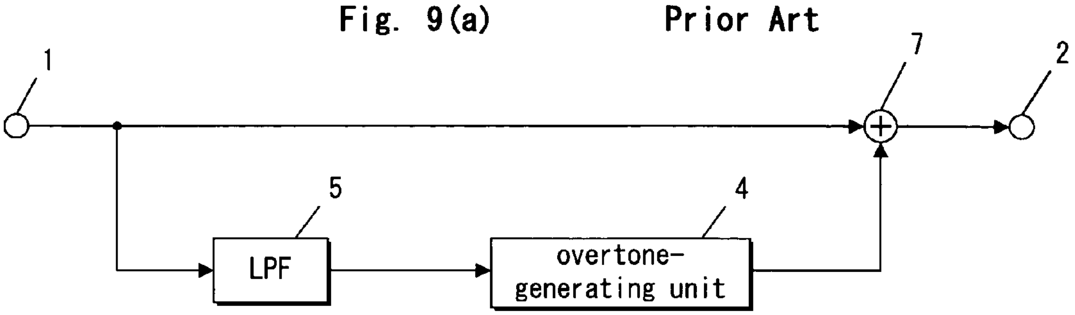
Fig. 9(a) Prior Art
FIG. 9(*a*) is a block diagram illustrating a first prior art acoustic signal-processing apparatus.
Figure 9B:
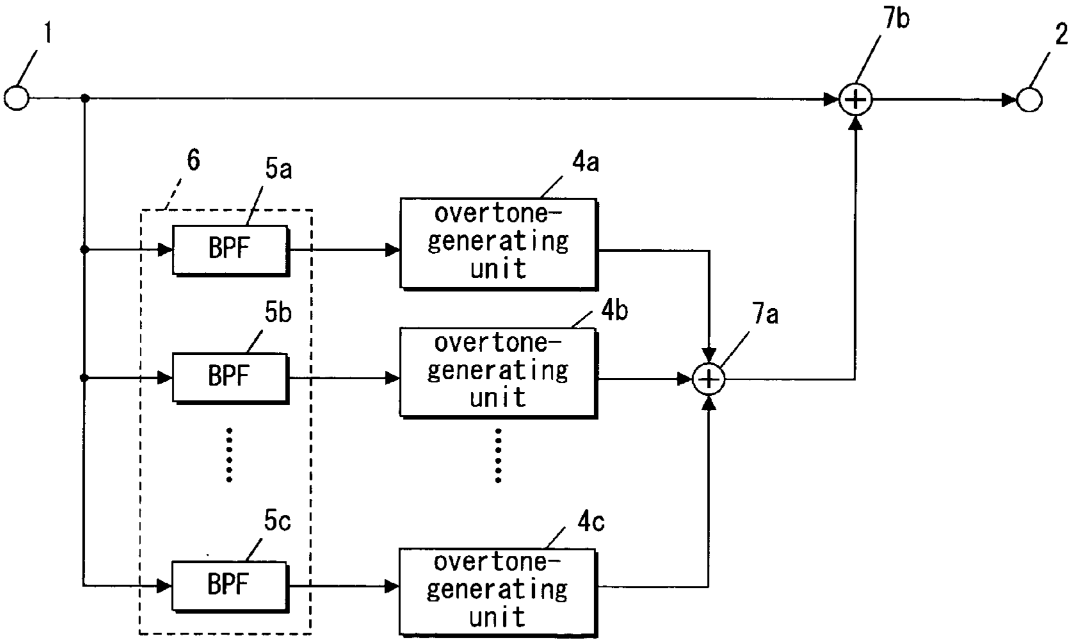
Fig. 9(b) Prior Art
Figure 10A:
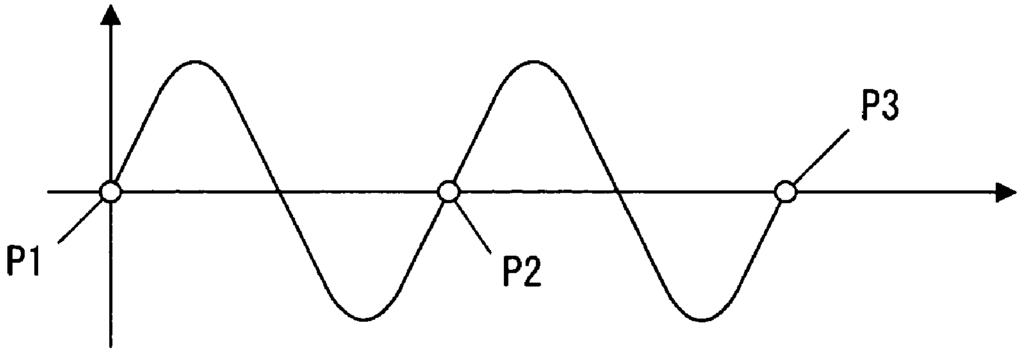
Fig. 10(a) Prior Art
FIG. 10(*a*) is a descriptive illustrating showing a prior art overtone-generating principle.
Figure 10B:
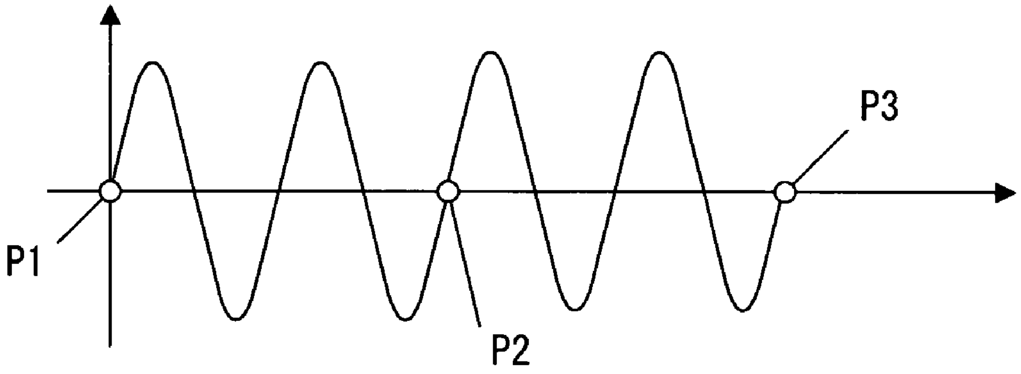
Fig. 10(b) Prior Art

The structure of FIG. 1(*a*) can be modified in such a manner as illustrated in FIG. 8(*a*). According to the present variation, a decimeter 31 is disposed between the input terminal 1 and the band-dividing unit 6, while an interpolator 32 is provided between the adder “7*a*” and the adder “7*b*”.

The decimeter 31 includes a low pass filter 33 and a down-sampler 34. The low pass filter 33 allows only low frequency components in an entering acoustic signal to pass the low pass filter 33, thereby reducing an aliasing distortion that otherwise would occur heavily during downsampling. Assume that “p” is a positive integer. The down-sampler 34 is operable to reduce a sampling frequency of an input signal to one over “p” of the sampling frequency before feeding the input signal into the band-dividing unit 6.

As a result, the band-dividing unit 6, overtone-generating units “4*a*” to “4*c*”, and adder “7*a*” according to the present variation are smaller in processed amount per unit time than those components of FIG. 1(*a*). Similarly, the band-dividing unit 6 and overtone-generating units “4*a*” to “4*c*” according to the present variation are made smaller in memory capacity than those of FIG. 1(*a*). As a result, the circuit according the present variation is considerably reduced in size, when compared with that of FIG. 1(*a*).

The interpolator 32 includes an up-sampler 35 and a low pass filter 36. The up-sampler 35 is operable to increase a sampling frequency of an output signal from the adder “7*a*” to a “p”-multiple of the sampling frequency, thereby setting the increased sampling frequency back to a sampling frequency of the entering acoustic signal. The low pass filter 36 allows only low frequency components in an output signal from the up-sampler 35 to pass the low pass filter 36, thereby eliminating, from the output signal, imaging components that otherwise would occur during upsampling.

The present variation is, of course, applicable to the structure of FIG. 7 other than that of FIG. 1(*a*).

(Variation 2)

The structure of FIG. 1(*a*) can be modified in such a manner as illustrated in FIG. 8(*b*). According to the present variation, a decimeter 31 is disposed between the input terminal 1 and the band-dividing unit 6. Interpolators "32*a*" to "32*c*" are provided between the overtone-generating units "4*a*" to "4*c*" and the adder 7*a* in such a manner as to be connected to the overtone-generating units "4*a*" to "4*c*", respectively.

The decimeter 31 is similar in construction to that according to the previous variation. As a result, the band-dividing unit 6 and overtone-generating units "4*a*" to "4*c*" according to the present variation are smaller in processed amount per unit time than those components of FIG. 1(*a*). Similarly, the band-dividing unit 6 and overtone-generating units "4*a*" to "4*c*" according to the present variation are made smaller in memory capacity than those of FIG. 1(*a*). As a result, the circuit according the present variation is considerably reduced in size, when compared with that of FIG. 1(*a*).

The interpolators "32*a*" to "32*c*" include up-samplers "35*a*" to "35*c*" and low pass filters "36*a*" to "36*c*", respectively. Each of the up-samplers "35*a*" to "35*c*" is operable to increase a sampling frequency of an output signal from each of the overtone-generating units "4*a*" to "4*c*" to a "p"-multiple of the sampling frequency, thereby setting the increased sampling frequency back to a sampling frequency of the entering acoustic signal. Each of the low pass filters "36*a*" to "36*c*" allows only low frequency components in an output signal from each of the up-samplers "35*a*" to "35*c*" to pass a corresponding one of the low pass filters "36*a*" to "36*c*", thereby eliminating, from the output signal, imaging components that otherwise would occur during upsampling.

The present variation is, of course, applicable to the structure of FIG. 7 other than that of FIG. 1(*a*).

(Evaluation)

The present inventors evaluated the comparative example and patterns 1 and 3 as described above. The following discusses results from the evaluation.

It is to be noted that neither pattern 2 nor pattern 4 were evaluated, but it is presumed that patterns 2 and 4 provide results similar to those of patterns 1 and 3, respectively.

Two listeners "A" and "B" listened to an original sound and three different processed sounds. Each of the three different processed sounds had overtones generated in accordance with corresponding one of patterns 1 and 3, and the comparative example. The listeners "A" and "B" determined how much a feeling of bass sound had been improved. The listeners "A"and "B" checked for a feeling of distortion as well.

In the test, three different sound sources as given below were played.

Source 1:

Artist name: Noriyuki Makihara;

Music title: "Spy"; and

Evaluated track: a half-minute from the start of the music.

Source 2:

Artist name: Cindy Loper;

Music title: "Hey Now"; and

Evaluated track: a half-minute from the start of the music.

Source 3:

Artist name: Diana King;

Music title: "Shy Guy"; and

Evaluated track: a half-minute after 40 seconds elapsed from the start of the music.

The listener "A" had impressions as given below.

"How much do you think a feeling of bass sound has been improved?"

| | Source 1 | Source 2 | Source 3 |
|---|---|---|---|
| Comparative example | – | – | – |
| Pattern 1 | ++ | ++ | ++ |
| Pattern 3 | ++ | + | ++ |

++: well improved;
+: rather improved; and
–: substantially not improved.

"Did you have a feeling of distortion?"

| | Source 1 | Source 2 | Source 3 |
|---|---|---|---|
| Comparative example | – | – | – |
| Pattern 1 | ++ | ++ | ++ |
| Pattern 3 | ++ | ++ | ++ |

++: substantially did not at all;
+: somewhat did; and
–: considerably did.

The listener "B" had impressions as given below.

"How do you think a feeling of bass sound has been improved?"

| | Source 1 | Source 2 | Source 3 |
|---|---|---|---|
| Comparative example | + | + | + |
| Pattern 1 | ++ | ++ | ++ |
| Pattern 3 | + | + | + |

++: well improved;
+: rather improved; and
–: substantially not improved.

"Did you have a feeling of distortion?"

| | Source 1 | Source 2 | Source 3 |
|---|---|---|---|
| Comparative example | ++ | + | – |
| Pattern 1 | ++ | ++ | ++ |
| Pattern 3 | ++ | ++ | ++ |

++: substantially did not at all;
+: somewhat did; and
–: considerably did.

(Considerations)

Both of the listeners highly value pattern 1 in terms of a higher effect on improvements in feeling of bass sound and a less feeling of distortion. Therefore, pattern 1 is believed to be the best.

It was found from the above results that the comparative example was impractical because of a higher feeling of distortion. The distortion destroyed the effect of an improved feeling of bass sound. Furthermore, the distortion forced instrumental bass sound in the source to be displaced toward an intermediate- or high-pitched sound, or to be queerly varied in tone.

Pattern 3 was inferior to pattern 1 with respect to a feeling of bass sound, but was more articulate in sound quality than pattern 1.

Generally judging from the results, both of patterns 1 and 3 were superior to the comparative example in terms of the effect of an improved feeling of bass sound and a feeling of less distortion.

Pursuant to the present invention, one overtone-generating unit designed for a higher frequency band among the different frequency bands is set to generate the same or fewer overtones than another overtone-generating unit suited for a lower frequency band thereamong does. This feature produces a train of continuous overtones with a less amount of calculation, while collectively generating the overtones at a low frequency that falls within the range of the speaker reproducible band.

Pursuant to the present invention, the structure of each of the generated overtones during the introduction of band splitting can be optimized to achieve less degradation in sound quality and a higher feeling of bass sound.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An acoustic signal-processing apparatus comprising:

a band-dividing unit operable to divide an entering acoustic signal into divided components that belong to several frequency bands;

an overtone-generating unit operable to generate, under predetermined conditions, one or more overtone components based on each of the divided components that belong to the several frequency bands; and a combining unit operable to combine the entering acoustic signal with the one or more overtone components generated by said overtone-generating unit, wherein the predetermined conditions include:

a condition that a first maximum degree among one or more degrees of the one or more overtone components generated based on a component belonging to a first frequency band among the several frequency bands is not greater than a second maximum degree among one or more degrees of the one or more overtone components generated based on a component belonging to a second frequency band among the several frequency bands, the second frequency band being lower than the first frequency band; and a condition that a third maximum degree among one or more degrees of the one or more overtone components generated based on a component belonging to the highest frequency band among the several frequency bands is less than a fourth maximum degree among one or more degrees of the one or more overtone components generated based on a component belonging to the lowest frequency band among the several frequency bands.

2. An acoustic signal-processing apparatus as defined in claim 1, wherein each of the one or more overtone components have amplitude set to decrease with an increase in frequency.

3. An acoustic signal-processing apparatus as defined in claim 1, wherein the one or more overtone components generated by said overtone-generating unit are within a range capable of being reproduced by a speaker, wherein the predetermined conditions further include:

a condition that a first least degree among one or more degrees of the one or more overtone components generated based on a component belonging to the highest frequency band is not greater than a second least degree among one or more degrees of the one or more overtone components generated based on a component belonging to the lowest frequency band.

4. An acoustic signal-processing apparatus as defined in claim 3, wherein the predetermined conditions further include:

a condition that only a single degree of overtone component is generated with respect to each band of the several frequency bands.

5. An acoustic signal-processing apparatus as defined in claim 4, wherein the single degree of overtone component is a reachable least degree, the reachable least degree being a least degree that reaches an envisaged speaker reproducible band.

6. An acoustic signal-processing apparatus as defined in claim 4, wherein the single degree is set in such a manner that one or more overtone components generated based on the divided components that belong to the several frequency bands have frequencies non-overlapped with each other.

7. An acoustic signal-processing method comprising:

dividing an entering acoustic signal into divided components that belong to several frequency bands;

generating, under predetermined conditions, one or more overtone components based on each of the divided components that belong to the several frequency bands; and combining the entering acoustic signal with the one or more overtone components;

wherein the predetermined conditions include:

a condition that a first maximum degree among one or more degrees of the one or more overtone components generated based on a component belonging to a first frequency band among the several frequency bands is not greater than a second maximum degree among one or more degrees of the one or more overtone components generated based on a component belonging to a second frequency band among the several frequency bands, the second frequency band being lower than the first frequency band; and a condition that a third maximum degree among one or more degrees of the one or more overtone components generated based on a component belonging to the highest frequency band among the several frequency bands is less than a fourth maximum degree among one or more degrees of the one or more overtone components generated based on a component belonging to the lowest frequency band among the several frequency bands.

* * * * *